United States Patent
Park et al.

(10) Patent No.: US 9,240,415 B2
(45) Date of Patent: Jan. 19, 2016

(54) SEMICONDUCTOR DEVICE AND METHOD OF FORMING THE SAME

(71) Applicant: SAMSUNG ELECTRONICS CO., LTD., Gyeonggi-do (KR)

(72) Inventors: Won-Kyung Park, Seoul (KR); Ki-Jae Hur, Seoul (KR); Hyeong-Sun Hong, Gyeonggi-do (KR); Se-Young Kim, Gyeonggi-do (KR); Jun-Hee Lim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 22 days.

(21) Appl. No.: 14/312,777

(22) Filed: Jun. 24, 2014

(65) Prior Publication Data

US 2015/0008530 A1 Jan. 8, 2015

(30) Foreign Application Priority Data

Jul. 5, 2013 (KR) ........................ 10-2013-0078716

(51) Int. Cl.
| | | |
|---|---|---|
| H01L 21/70 | (2006.01) | |
| H01L 27/108 | (2006.01) | |
| H01L 29/06 | (2006.01) | |
| H01L 21/265 | (2006.01) | |
| H01L 21/28 | (2006.01) | |

(52) U.S. Cl.
CPC ........ *H01L 27/10897* (2013.01); *H01L 21/265* (2013.01); *H01L 21/28158* (2013.01); *H01L 27/10894* (2013.01); *H01L 29/0649* (2013.01); H01L 27/10814 (2013.01); H01L 27/10823 (2013.01)

(58) Field of Classification Search
CPC ............ H01L 27/10894; H01L 21/265; H01L 27/10897
USPC .......................................................... 257/369
See application file for complete search history.

(56) References Cited

U.S. PATENT DOCUMENTS

| | | | |
|---|---|---|---|
| 6,798,018 | B2 | 9/2004 | Takaishi et al. |
| 6,994,045 | B2 | 2/2006 | Paszkowski |
| 7,271,068 | B2 | 9/2007 | Kubo et al. |
| 7,675,110 | B2 | 3/2010 | Uchiyama |
| 8,071,445 | B2 | 12/2011 | Takehara |
| 2008/0048333 | A1 | 2/2008 | Seo et al. |
| 2010/0258863 | A1 | 10/2010 | Kaneko |
| 2012/0241855 | A1 | 9/2012 | Nakazawa et al. |

FOREIGN PATENT DOCUMENTS

| | | |
|---|---|---|
| JP | 2009146994 | 7/2009 |
| KR | 1020050061221 | 6/2005 |
| KR | 1020080087304 | 10/2008 |

*Primary Examiner* — Elias M Ullah
(74) *Attorney, Agent, or Firm* — F. Chau & Associates, LLC

(57) ABSTRACT

A semiconductor device is provided. A cell region is disposed in a substrate. The cell region includes a memory cell. A peripheral region is disposed in the substrate. The peripheral region is adjacent to the cell region. The peripheral region has a trench isolation, a first active region and a second active region. The trench isolation is interposed between the first active region and the second active region. A common gate pattern is disposed on the peripheral region. The common gate pattern extends in a first direction and partially overlaps the first active region, the second active region and the trench isolation. A buried conductive pattern is enclosed by the trench isolation. The buried conductive pattern extends in a second direction crossing the first direction. A top surface of the buried conductive pattern is lower than a bottom surface of the common gate pattern.

20 Claims, 18 Drawing Sheets

SEMICONDUCTOR DEVICE AND METHOD OF FORMING THE SAME

CROSS-REFERENCE TO RELATED APPLICATION

This application claims priority under 35 USC §119 to Korean Patent Application No. 10-2013-0078716, filed on Jul. 5, 2013 in the Korean Intellectual Property Office (KIPO), the disclosure of which is incorporated by reference herein in its entirety.

TECHNICAL FIELD

The present inventive concept relates to semiconductor device and method of manufacturing the same.

DISCUSSION OF RELATED ART

Complementary Metal Oxide Semiconductor (CMOS) transistors include a P-type Metal Oxide Semiconductor (PMOS) transistor serving as a pull-up transistor and an N-type Metal Oxide Semiconductor (NMOS) transistor serving as a pull-down transistor. As more CMOS transistors are packed on smaller areas, parasitic capacitance may affect the operation and speed of the CMOS transistors.

SUMMARY

According to an exemplary embodiment of the inventive concept, a semiconductor device is provided. A substrate includes an isolation region, a first region disposed at one side of the isolation region and a second region disposed at an opposite side of the isolation region. The first region and the second region are arranged in a first direction. A trench is disposed in the isolation region. An insulation layer pattern structure is disposed in the trench. A buried conductive pattern is enclosed by the insulation layer pattern structure. The buried conductive pattern has a top surface lower than a top surface of the substrate. The buried conductive pattern extends in a second direction crossing the first direction. A first gate insulation layer is disposed on the substrate. A common gate pattern is disposed on the first gate insulation layer. The common gate pattern extends in the first direction. The common gate pattern overlaps the first region, the isolation region and the second region. A first source region and a drain region are disposed in upper portions of the first region. The first source region is disposed at one side of the common gate pattern. The first drain region is disposed at an opposite side of the common gate pattern. The first source region and the first drain region have impurities of a first conductivity type. A second source region and a second drain region are disposed in upper portions of the second region. The second source region is disposed at one side of the common gate pattern. The second drain source region is disposed at an opposite side of the common gate pattern. The second source region and the second drain region have impurities of a second conductivity type.

According to an exemplary embodiment of the inventive concept, a method of manufacturing a semiconductor device is provided. A trench is formed in a substrate. The substrate includes a first region disposed at one side of the trench and a second region disposed at an opposite side of the trench. The first region and the second region are arranged in a first direction. A first insulation layer pattern is formed in the trench to fill the trench. A recess is formed in the first insulation layer pattern. The recess extends in a second direction crossing the first direction. A buried conductive pattern is formed in the recess. The buried conductive pattern extends in the second direction and has a top surface lower than a top surface of the substrate. A second insulation pattern is formed in the recess. The second insulation pattern covers the buried conductive pattern in the recess. A first gate insulation layer is formed on the substrate and the second insulation pattern. A common gate pattern is formed on the first region, the second region and the second insulation pattern. The common gate pattern extends in the first direction. Impurities of a first conductivity type are implanted into the first region. Impurities of a second conductivity type are implanted into the second region.

According to an exemplary embodiment of the inventive concept, a semiconductor device is provided. A cell region is disposed in a substrate. The cell region includes a memory cell. A peripheral region is disposed in the substrate. The peripheral region is adjacent to the cell region. The peripheral region has a trench isolation, a first active region and a second active region. The trench isolation is interposed between the first active region and the second active region. A common gate pattern is disposed on the peripheral region. The common gate pattern extends in a first direction and partially overlaps the first active region, the second active region and the trench isolation. A buried conductive pattern is enclosed by the trench isolation. The buried conductive pattern extends in a second direction crossing the first direction. A top surface of the buried conductive pattern is lower than a bottom surface of the common gate pattern.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
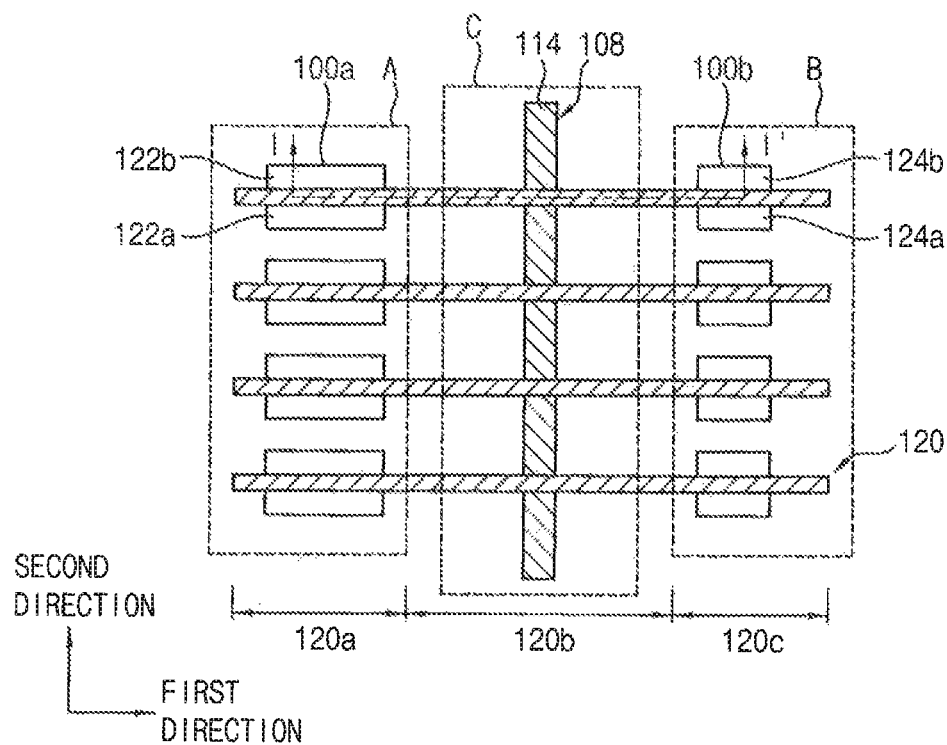
FIG. 1 is a top view illustrating a semiconductor device in accordance with an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, example embodiments will be explained in detail with reference to the accompanying drawings.

Figure 2:
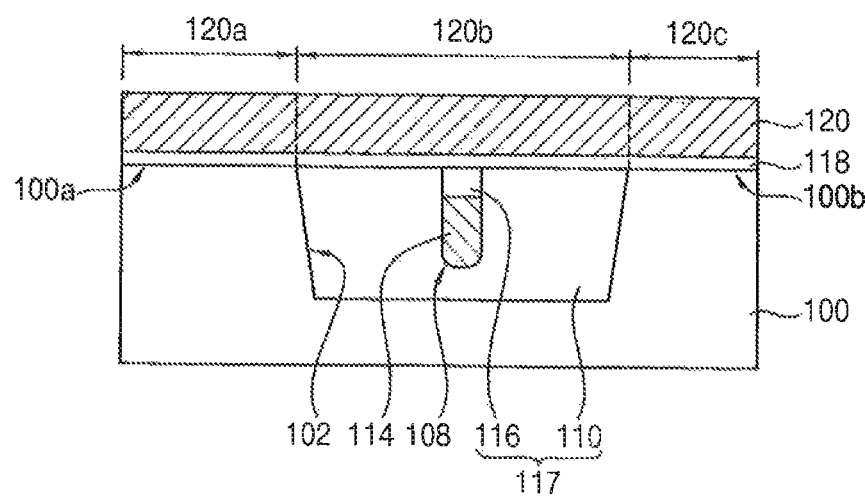
FIG. 2 is a cross-sectional view taken along line I-I' of the semiconductor device of FIG. 1, in accordance with an exemplary embodiment of the inventive concept.

FIG. 1 is a top view of a semiconductor device in accordance with an exemplary embodiment, and FIG. 2 is a cross-sectional view taken along line I-I' of the semiconductor device of FIG. 1 in accordance with an exemplary embodiment.

The semiconductor device may include a plurality of complementary metal oxide semiconductor (CMOS) transistors repeatedly arranged on a substrate.

Referring to FIGS. 1 and 2, the semiconductor device include a substrate 100 having a first region A for forming a N-type metal oxide semiconductor (NMOS) transistors and a second region B for forming a P-type metal oxide semiconductor (PMOS) transistors. The first and second regions A and B may be opposite to each other along a first direction.

An isolation region C is formed between the first and second regions A and B on the substrate 100. The isolation region C includes an insulation layer pattern structure 117 formed in a trench 102. The trench 102 may be formed by partially etching the substrate 100. The insulation layer pattern structure 117 may include a first insulation layer pattern 110 formed on an inner wall of the trench 102. A buried conductive pattern 114 is disposed in the first insulation layer pattern 110. A second insulation layer pattern 116 covers a top surface of the buried conductive pattern 114. The first insulation layer pattern 110 may include an insulating material substantially the same as or different from that of the second insulation layer pattern 116.

Hereinafter, a top surface of the substrate 100 that is not covered by the insulation layer pattern structure 117 is substantially coplanar with a top surface of the insulation layer pattern structure 117. The top surface of the substrate 100 may be top surfaces of active regions 100a and 100b of the substrate 100 which are substantially coplanar with the top surface of the insulation layer pattern structure 117.

A buried conductive pattern 114 is formed in the trench 102. The top surface of the buried conductive pattern 114 is lower than the top surface of the substrate 100. The buried conductive pattern 114 has a linear shape extending in a second direction substantially perpendicular to the first direction.

The buried conductive pattern 114 is buried in the insulation layer pattern structure 117 without contacting the sidewall of the trench 102. For example, the entire sidewall and bottom surface of the buried conductive pattern 114 is in contact the first insulation layer pattern 110 and the top surface of the buried conductive pattern 114 is in contract with the second insulation layer pattern 116. In other example embodiments, the buried conductive pattern 114 may contact a sidewall of the trench. Alternatively, at least a portion of the buried conductive pattern 114 may be in contact with the substrate 100, and a remaining portion of the buried conductive pattern 114 may be in contact with the first insulation layer pattern 110.

The buried conductive pattern 114 may include polysilicon, a metal, a metal nitride, or a combination thereof. The metal or the metal nitride of the buried conductive pattern 114 may include titanium, titanium nitride, tantalum, tantalum nitride, or tungsten.

A liner (not shown) may be further formed on the sidewall and the bottom surface of the buried conductive pattern 114.

The buried conductive pattern 114 may serve as a wiring line electrically connected to other circuit patterns (not shown).

First active regions 100a are formed in the first region A of the substrate 100. The first active regions 100a have an island-type shape separated from each other, and the first active regions 100a are arranged in the second direction. NMOS transistors may be formed on the first active regions 100a.

Second active regions 100b are formed in the second region B of the substrate 100. The second active regions 100b have an island-type shape separated from each other, and the second active regions 100b are arranged in the second direction. PMOS transistors may be formed on the second active regions 100b.

A single inverter may be formed using a single NMOS transistor and a single PMOS transistor. Each PMOS transistor may be opposite to each NMOS transistor along the first direction. Each of the second active regions 100b may be opposite to each of the first active regions 100a along the first direction.

The NMOS and PMOS transistors opposite to each other along the first direction share a common gate pattern 120. The common gate pattern 120 extends on the first region A, the isolation region C and the second region B in the first direction. For example, the common gate pattern 120 overlaps the first region A, the isolation region C and the second region. A gate insulation layer 118 may be formed beneath the common gate pattern 120.

The NMOS and PMOS transistors may be formed on the first and second active regions A and B, respectively. The NMOS transistors are arranged in the second direction with a spacing between neighboring two NMOS transistors. The PMOS transistors are arranged in the second direction with a spacing between neighboring two PMOS transistors. A plurality of common gate patterns 120 is arranged in the second direction, and each common gate pattern 120 is arranged to be substantially parallel to another.

The common gate pattern 120 includes a first gate portion 120a serving as a gate electrode of the NMOS transistor, a second gate portion 120c serving as a gate electrode of the PMOS transistor, and a connection portion 120b connecting the first and second gate portions 120a and 120c. Due to the common gate pattern 120, the first and second gate portions 120a and 120c are connected to each other without using additional contact plugs or conductive lines. The first and second gate portions 120a and 120c and the connection portion 120b may have substantially the same width.

A first source region 122a and a first drain region 122b are formed in upper portions of the first active region 100a at both sides of the first gate portion 120a, respectively.

A second source region 124a and a second drain region 124b are formed in upper portions of the second active region 100b at both sides of the second gate portion 120c, respectively.

The buried conductive pattern 114 may serve as a wiring line. For example, the wiring line extends in the second direction substantially perpendicular to the first direction in which the common gate pattern 120 of the NMOS and PMOS transistors extends. The buried conductive pattern 114 has a top surface lower than a top bottom surface of the common gate pattern 120. Thus, the common gate pattern 120 extending in the first direction may be placed and routed regardless of the routing of the wiring line.

FIGS. 3 to 7 are cross-sectional views illustrating a method of manufacturing the semiconductor device of FIG. 1 in accordance with an exemplary embodiment. FIGS. 8 to 11 are top views illustrating a method of manufacturing the semiconductor device of FIG. 1 in accordance with an exemplary embodiment.

Figure 3:
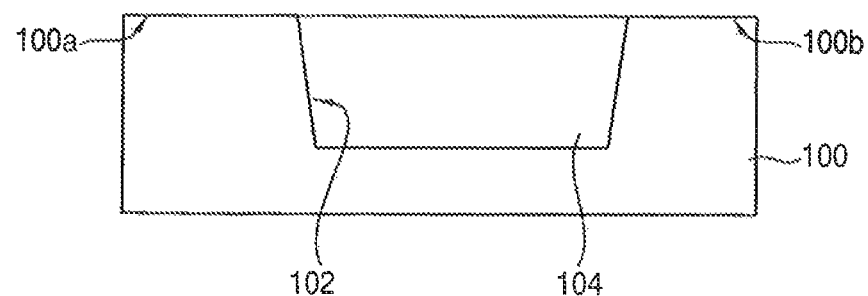
FIGS. 3 to 7 are cross-sectional views illustrating a method of manufacturing the semiconductor device of FIG. 1 in accordance with an exemplary embodiment of the inventive concept.
Figure 8:
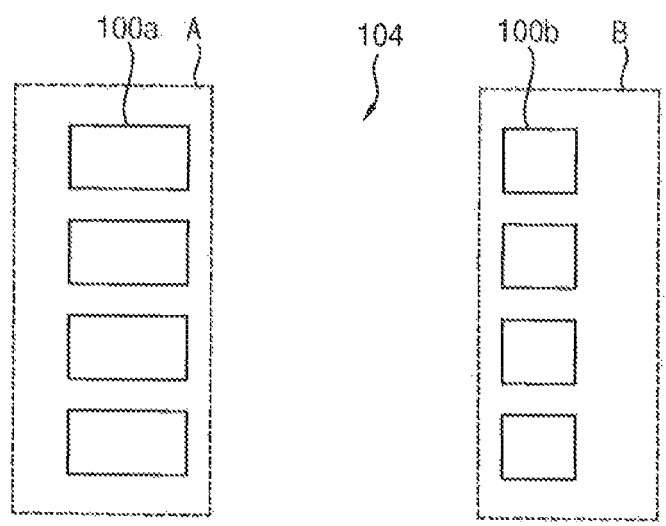
FIGS. 8 to 11 are top views illustrating a method of manufacturing the semiconductor device of FIG. 1 in accordance with an exemplary embodiment of the inventive concept.

Referring to FIGS. 3 and 8, a first etch mask pattern (not shown) is formed on a substrate 100. The substrate 100 has a first region A for forming NMOS transistors and a second region B for forming PMOS transistors.

The substrate 100 is etched using the first etch mask pattern to form a trench 102. The trench 102 is formed between the first region A and the second region B, and further is formed between the first active regions 100a in the first region A, and between the second active regions 100b in the second region B.

A first insulation layer is formed to fill the trench 102. The first insulation layer is planarized to form a preliminary first insulation layer pattern 104 in the trench 102. The first etch mask pattern is removed.

Figure 4:
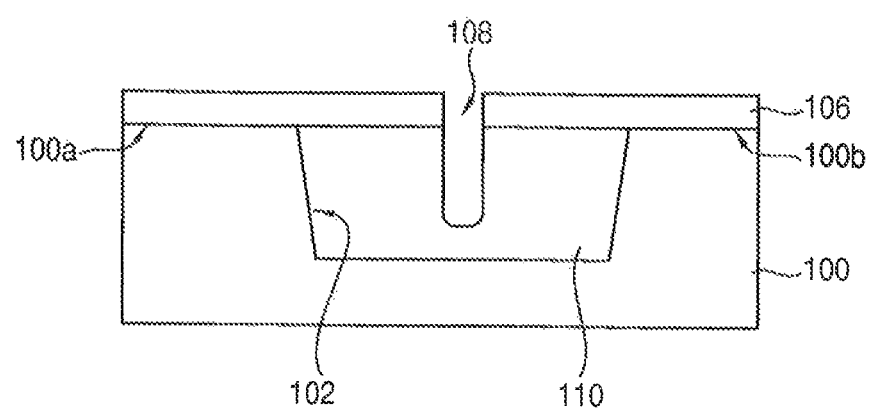
Figure 9:
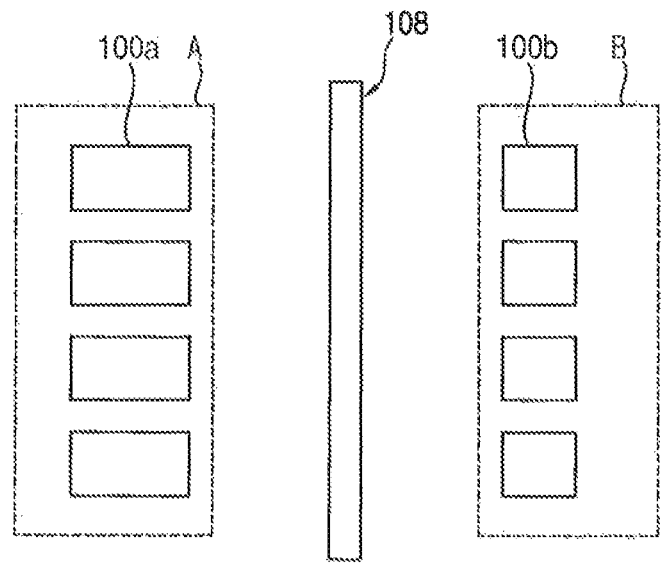

Referring to FIGS. 4 and 9, a second etch mask pattern 106 is formed on the preliminary first insulation pattern 104 and the substrate 100. The second etch mask pattern 106 exposes a portion of the preliminary first insulation pattern 104 under which a buried conductive pattern 114 of FIG. 6 will be formed later.

The preliminary first insulation pattern 104 is partially etched using the second etch mask pattern 106 to form a recess 108. The preliminary first insulation pattern 104 having the recess 108 may be referred to as a first insulation layer pattern 110.

The recess 108 has a linear shape extending in the second direction. The recess 108 is formed in the preliminary first insulation layer pattern 104. Alternatively, the recess 108 may penetrate through the preliminary first insulation layer pattern 104 into a portion of the substrate 100.

A liner (not shown) may be optionally formed on an inner wall of the recess 108.

Figure 5:
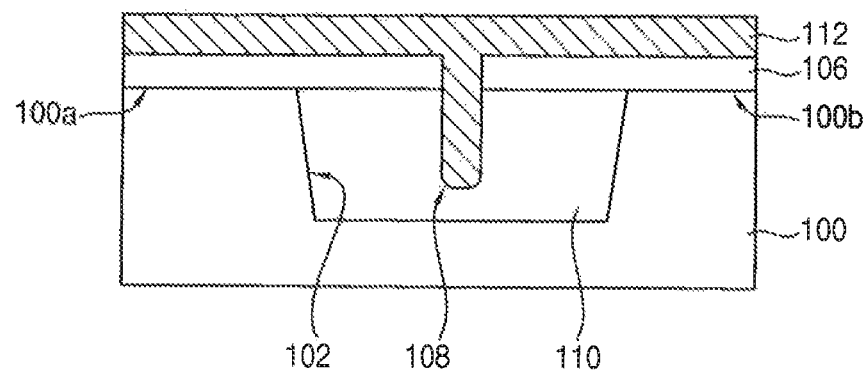

Referring to FIG. 5, a conductive layer 112 is formed on the first insulation layer pattern 110 and the second etch mask pattern 106 to sufficiently fill the recess 108.

The conductive layer 112 may include polysilicon, a metal, a metal nitride, or a combination thereof. The metal or the metal nitride of the conductive layer 112 may include titanium, titanium nitride, tantalum, tantalum nitride, or tungsten.

Figure 6:
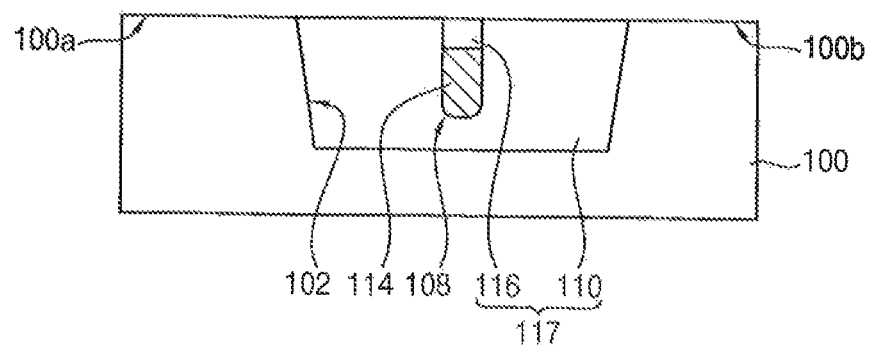
Figure 10:
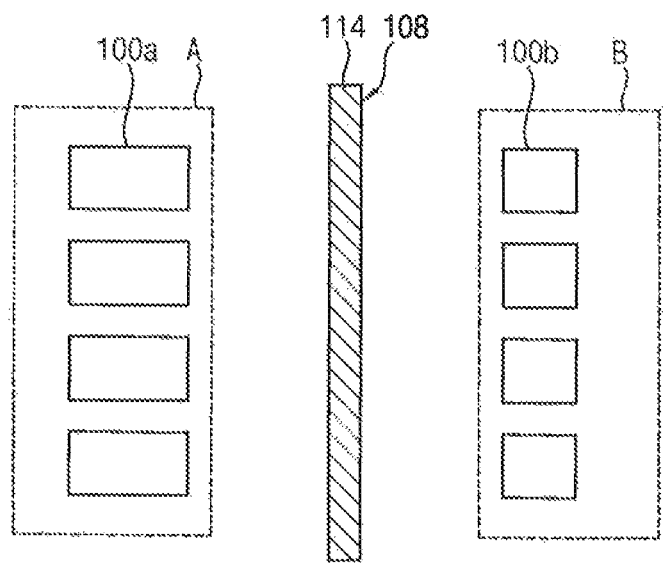

Referring to FIGS. 6 and 10, the conductive layer 112 is planarized so that the conductive layer 112 remains only in the recess 108. The planarization process may be performed by a chemical mechanical polishing (CMP) process and/or an etch back process. In the planarization process, the second etch mask pattern 106 is removed, and the substrate 100 and the first insulation layer pattern 110 are exposed.

The conductive layer 112 is partially etched to form the buried conductive pattern 114. The buried conductive pattern 114 has a top surface lower than the top surface of the substrate 100.

A second insulation layer is formed on the buried conductive pattern 114, the first insulation layer pattern 110 and the substrate 100 to fill the recess 108. The second insulation layer may include an insulating material substantially the same as or different from that of the first insulation layer. The insulating material may include silicon oxide, silicon nitride, or silicon oxide nitride.

The second insulation layer is planarized to form a second insulation layer pattern 116 on the buried conductive pattern 114. The buried conductive pattern 114 is buried in an insulation layer pattern structure 117 including the first and second insulation layer patterns 110 and 116.

Figure 7:
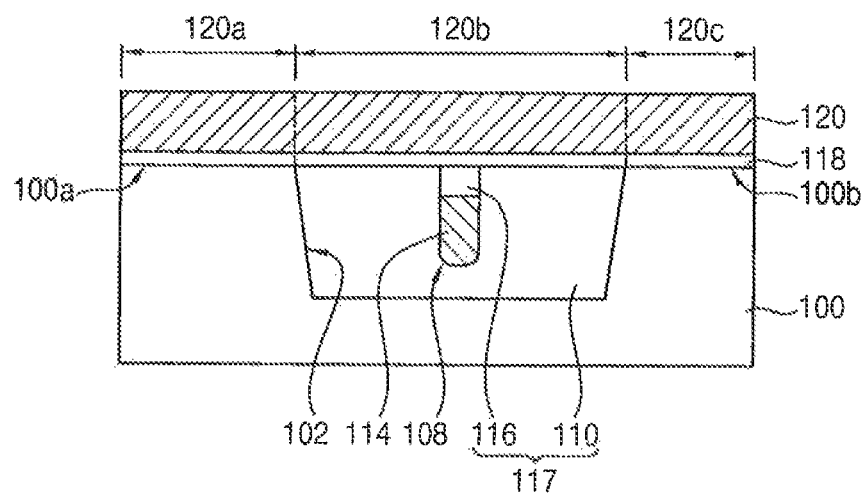
Figure 11:
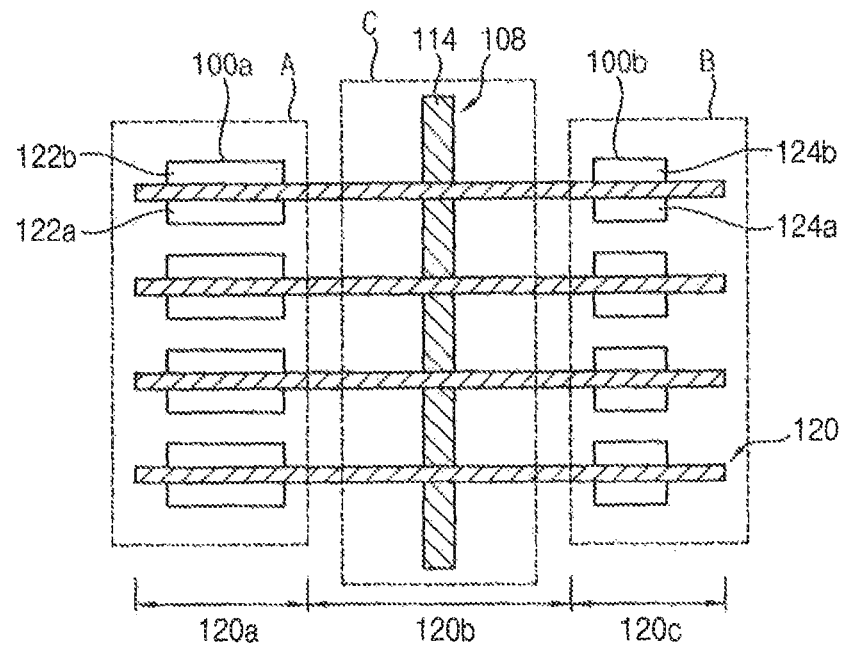

Referring to FIGS. 7 and 11, a gate insulation layer 118 and a gate electrode layer are formed on the substrate 100 and the insulation layer pattern 117. A third etch mask pattern (not shown) is formed on the gate electrode layer.

The gate electrode layer is etched using the third etch mask pattern to form common gate patterns 120. Each of the common gate patterns 120 extends in the first direction to serve as a common gate electrode of a pair of an NMOS transistor and a PMOS transistor. Each common gate pattern 120 may be arranged to be parallel to another.

Each common gate pattern 120 has a linear shape extending in the first direction. Each common gate pattern 120 is disposed on the first active region 100, the insulation layer pattern structure 117 and the second active region 110b. Each common gate pattern 120 includes first and second gate portions 120a and 120c serving as gate electrodes of the NMOS and PMOS transistors, respectively, and a connection portion 120b connecting the first and second gate portions 120a and 120c. The common gate patterns 120 connect the first portions 120a and the second gate portions 120c without using additional contact plugs or conductive lines.

N-type impurities are implanted into the substrate 100 in the first region A to form first source regions 122a and first drain regions 122b. P-type impurities are implanted into the substrate 100 in the second region B to form second source regions 124a and second drain regions 124b.

A semiconductor device including the common gate patterns 120 and the buried conductive pattern 114 is formed by the above processes.

Figure 12:
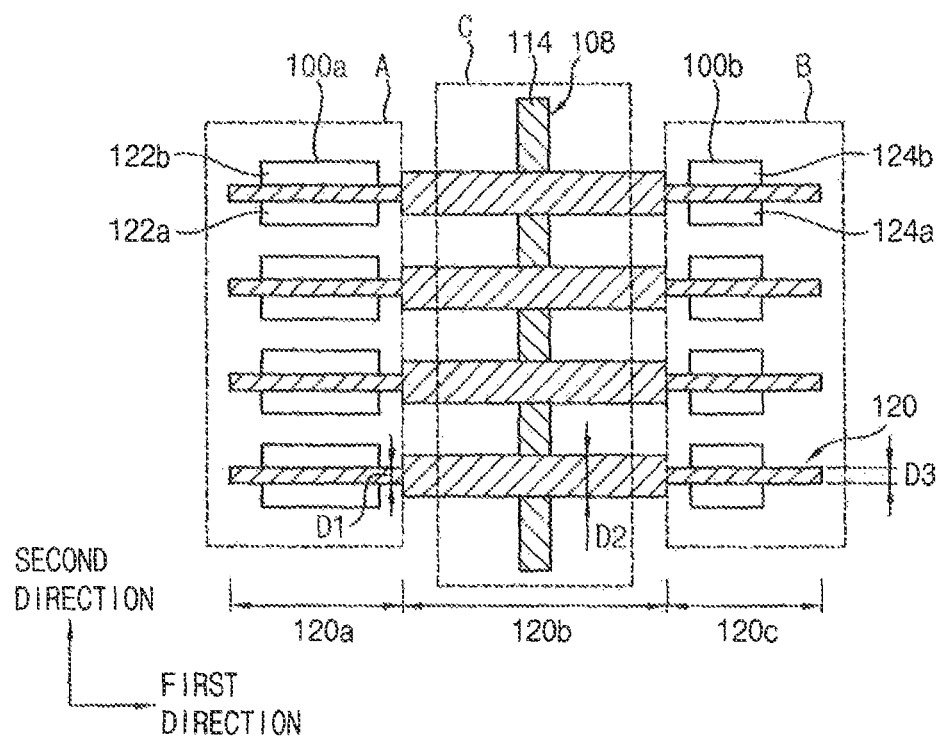
FIG. 12 is a top view illustrating a semiconductor device in accordance with an exemplary embodiment of the inventive concept.

FIG. 12 is a top view illustrating a semiconductor device in accordance with an exemplary embodiment.

The semiconductor device in FIG. 12 may have a structure substantially the same as that of the semiconductor device in FIGS. 1 and 2 except for a shape of a common gate pattern.

Referring to FIG. 12, a substrate 100 may have a first region A for forming NMOS transistors and a second region B for forming PMOS transistors. An isolation region C may be formed in the substrate 100 between the first and second regions A and B. The first and second regions A and B may be opposite to each other in a first direction.

A buried conductive pattern 114 extending in a second direction substantially perpendicular to the first direction may be formed in the insulation layer pattern structure 117 of FIG. 2 serving as the isolation region.

The gate insulation layer 118 of FIG. 2 may be formed on the top surfaces of the substrate 100 and the insulation layer pattern structure 117. In addition, a common gate pattern 120 is formed on the gate insulation layer 118 to extend in the first direction over the first region A, the isolation region C and the second region B.

The common gate pattern 120 includes a first gate portion 120a serving as a gate electrode of the NMOS transistor, a second gate portion 120c serving as a gate electrode of the PMOS transistor, and a connection portion 120b connecting the first and second gate portions 120a and 120c. Due to the common gate pattern 120, the first and second gate portions 120a and 120c are connected to each other without using additional contact plugs or conductive lines.

A width D1 of the first gate portion 120a may be determined in accordance with characteristics of the NMOS transistors. A width D3 of the second gate portion 120c may be determined in accordance with characteristics of the PMOS transistors. At least one of the first and second gate portions 120a and 120c and the connection portion 120b may have a width different from a width D2 of the connection portion 120b. For example, as shown in FIG. 12, the width D2 of the connection portion 102b is greater than those of the first and second portions 120a and 120c. The width D2 may be determined to reduce the resistance of the common gate pattern 120 regardless of the widths D1 and D3 of the first and second gate portions 120a and 120c.

Alternatively, the first and second gate portions 120a and 120c and the connection portion 120b of the common gate pattern 120 may have widths different from each other or substantially the same as each other.

A first source region 122a and a first drain region 122b are formed in upper portions of the first active region 100a at both sides of the first gate portion 120a, respectively. A second source region 124a and a second drain region 124b are formed in upper portions of the second active region 100b at both sides of the second gate portion 120c, respectively.

The semiconductor device in FIG. 12 may be formed by performing processes substantially the same as or similar to those illustrated with reference to FIGS. 3 to 7 except that each width of the first and second portions 120a and 120c and the connection portion 120b need not be substantially the same as each other.

Figure 13:
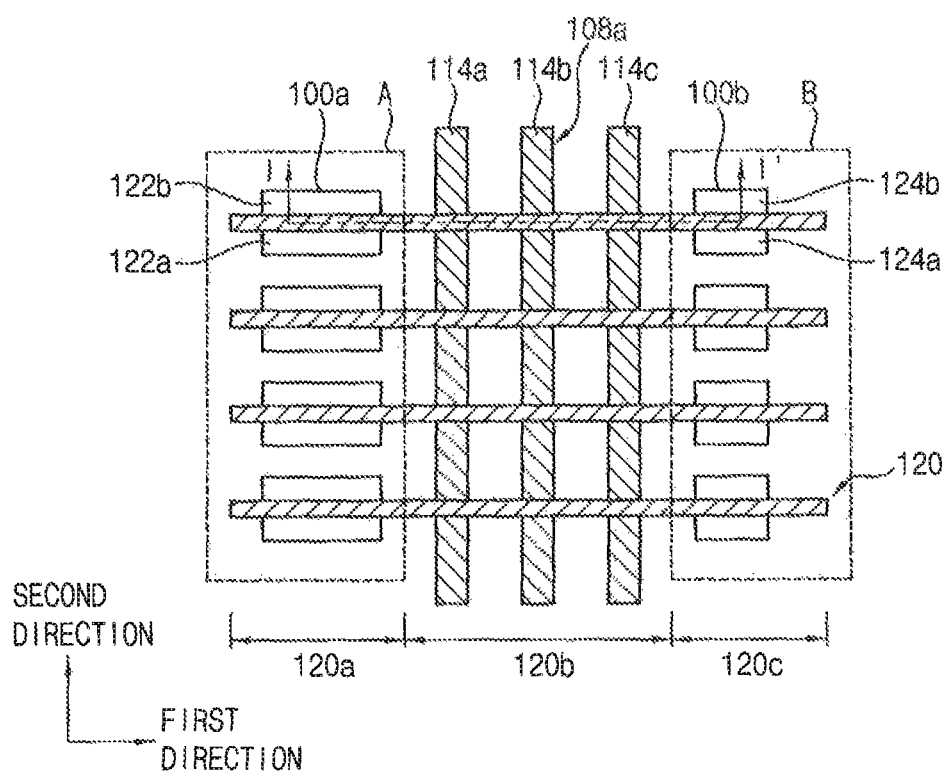
FIG. 13 is a top view illustrating a semiconductor device in accordance with an exemplary embodiment of the inventive concept.
Figure 14:
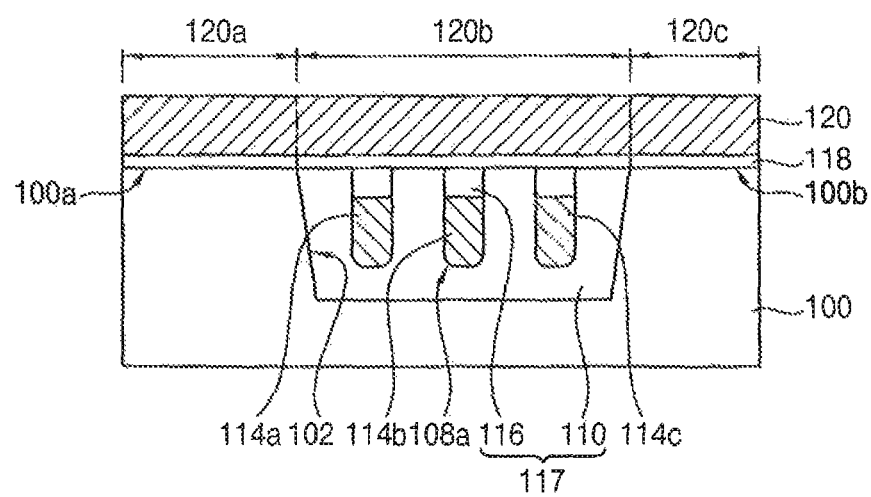
FIG. 14 is a cross-sectional view taken along line I-I' of the semiconductor device of FIG. 13, in accordance with an exemplary embodiment of the inventive concept.

FIG. 13 is a top view illustrating a semiconductor device in accordance with an exemplary embodiment. FIG. 14 is a cross-sectional view taken along line I-I' of the semiconductor device of FIG. 13.

The semiconductor device in FIG. 13 may be substantially same as that of the semiconductor device in FIGS. 1 and 2 except for a shape of a buried conductive pattern.

Referring to FIGS. 13 and 14, a substrate 100 includes a first region A for forming NMOS transistors and a second region B for forming PMOS transistors. An isolation region C is formed between the first and second regions A and B in the substrate 100. The first and second regions A and B are opposite to each other along a first direction.

A plurality of buried conductive patterns 114a, 114b and 114c are formed in an insulation layer pattern structure 117 serving as the isolation region C. The plurality of buried conductive patterns 114a, 114b and 114c extends in a second direction substantially perpendicular to the first direction. Each of the plurality of the buried conductive patterns 114a, 114b and 114c is arranged in parallel to another. Each of the plurality of the buried conductive patterns 114a, 114b and 114c has a linear shape, electrically insulated from another. Thus, each of the buried conductive patterns 114a, 114b and 114c may serve as a wiring line.

A gate insulation layer 118 is formed on a top surface of the substrate 100 and a top surface of the insulation layer pattern structure 117. A plurality of common gate patterns 120 is formed on the top surface of the first region A, the isolation region and the second region B. Each of the plurality of common gate patterns 120 is extended in the first direction.

A first source region 122a and a first drain region 122b are formed in upper portions of the first active region 100a at both sides of the first gate portion 120a, respectively. A second source region 124a and a second drain region 124b may be formed in upper portions of the second active region 100b at both sides of the second gate portion 120c, respectively.

Figure 15:
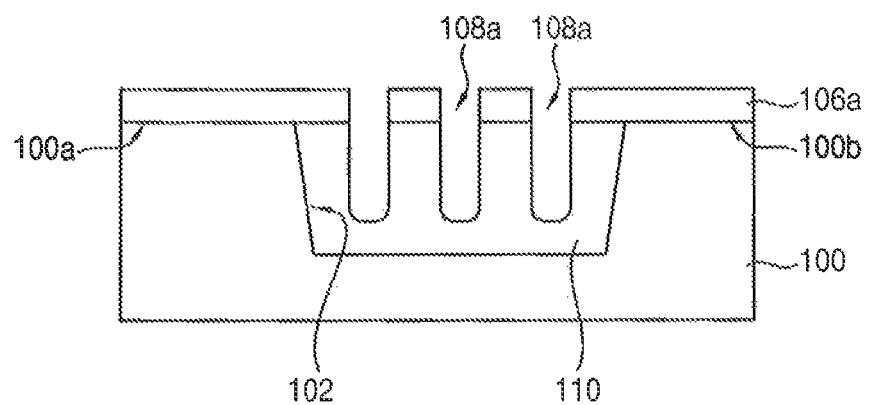
FIG. 15 is a cross-sectional view illustrating a method of manufacturing the semiconductor device of FIG. 13, in accordance with an exemplary embodiment of the inventive concept.
Figure 16:
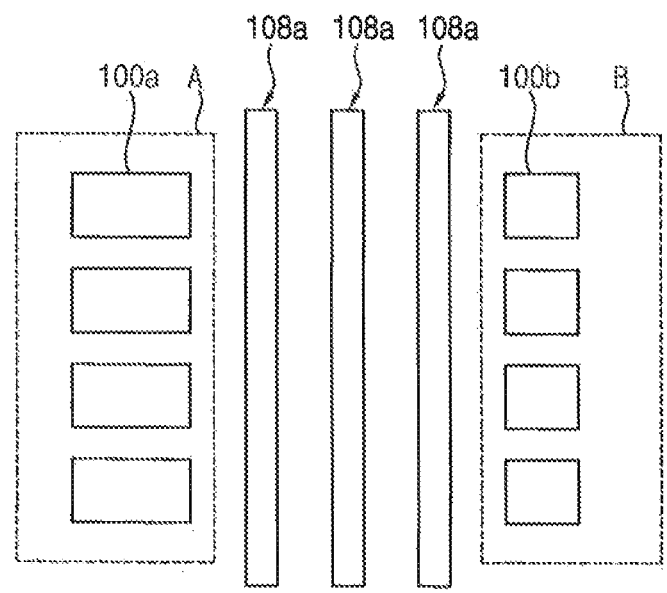
FIG. 16 is a top view illustrating a method of manufacturing the semiconductor device of FIG. 13, in accordance with an exemplary embodiment of the inventive concept.

FIG. 15 is a cross-sectional view illustrating a method of manufacturing the semiconductor device of FIG. 13, and FIG. 16 is a top view illustrating a method of manufacturing the semiconductor device of FIG. 13.

The process that is substantially the same as or similar to those described with reference to FIGS. 3 and 8 is performed.

Referring to FIGS. 15 and 16, an etch mask pattern 106a is formed on the preliminary insulation pattern 104 and the substrate 100. The etch mask pattern 106a exposes a portion of the preliminary insulation pattern 104 under which buried conductive patterns 114a, 114b and 114c of FIG. 13 will be formed later.

The preliminary insulation pattern 104 is partially etched using the etch mask pattern 106a to form a plurality of recesses 108a in which the buried conductive patterns 114a, 114b and 114c will be formed.

Then, the processes that are substantially the same as or similar to those described with reference to FIGS. 5 to 7 are performed to form the semiconductor device of FIGS. 13 and 14.

Figure 17:
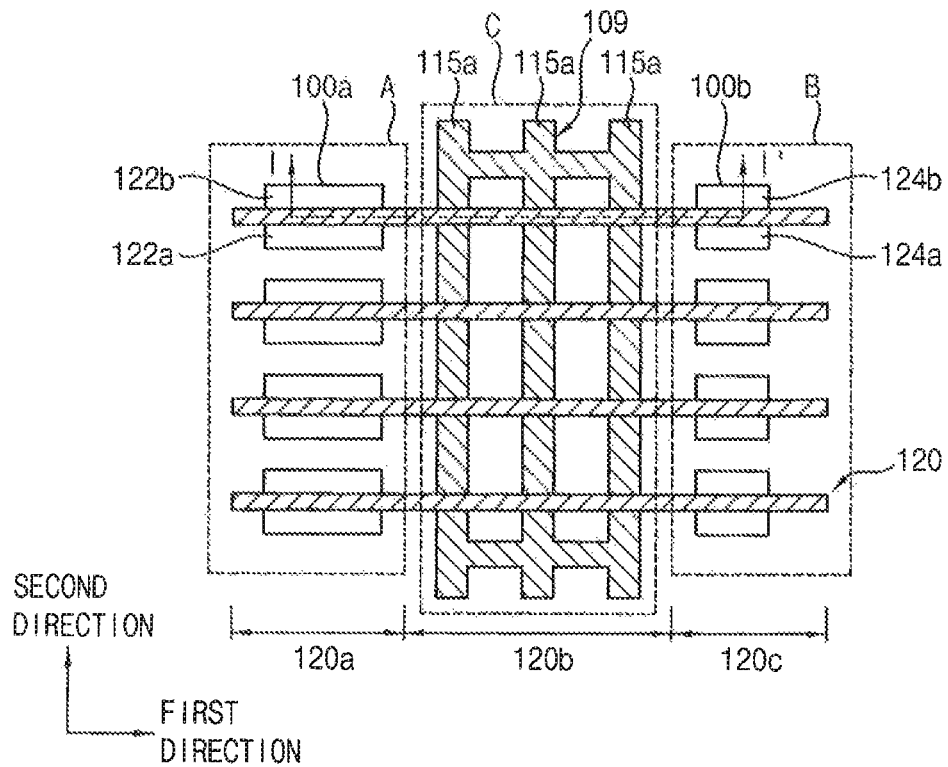
FIG. 17 is a top view illustrating a semiconductor device in accordance with an exemplary embodiment of the inventive concept.

FIG. 17 is a top view illustrating a semiconductor device in accordance with an exemplary embodiment.

The semiconductor device of FIG. 17 may have a structure substantially the same as that of FIGS. 1 and 2 except for a shape of a buried conductive pattern.

Referring to FIG. 17, a substrate has a first region A for forming NMOS transistors and a second region B for forming PMOS transistors. An isolation region C is formed in the substrate between the first and second regions A and B. The first and second regions A and B are opposite to each other in a first direction.

A plurality of buried conductive patterns 115a extending in a second direction is formed in the insulation layer pattern structure 117 of FIG. 2 serving as the isolation region. Each of the plurality of buried conductive patterns 115a is arranged in parallel to another. Each of the buried conductive patterns 115a has a linear shape extending in the second direction. The second direction is substantially perpendicular to the first direction.

At least two of the buried conductive patterns 115a may be electrically connected to each other. For example, each of the plurality of buried conductive patterns 115a is connected to another using a connection portion 115b, and thus the connected buried conductive patterns 115a may serve as a single wiring line to reduce resistance of the semiconductor device.

The gate insulation layer 118 of FIG. 2 is formed on top surfaces of the substrate 100 and the insulation layer pattern structure 117. A plurality of common gate patterns 120 is formed on the gate insulation layer 118 to extend in the first direction over the first region A, the isolation region and the second region B.

A first source region 122a and a first drain region 122b are formed in upper portions of the first active region 100a at both sides of the first gate portion 120a, respectively. A second source region 124a and a second drain region 124b are formed in upper portions of the first active region 100b at both sides of the first gate portion 120c, respectively.

Figure 18:
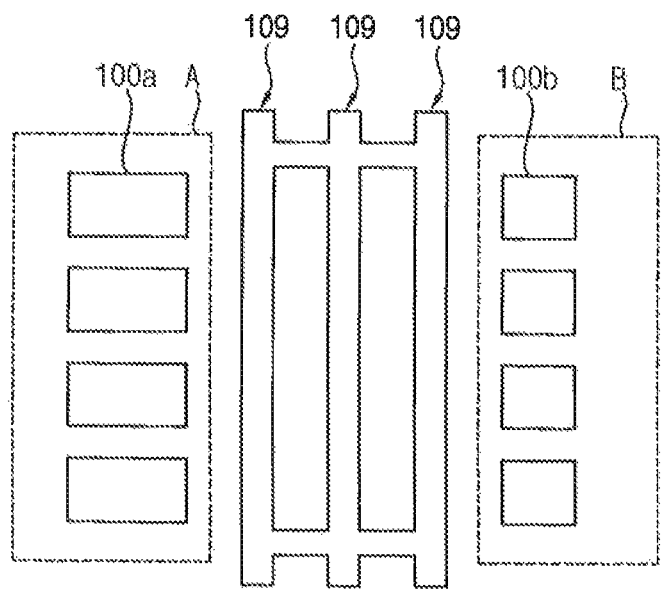
FIG. 18 is a top view illustrating a method of manufacturing the semiconductor device of FIG. 17 in accordance with an exemplary embodiment of the inventive concept.

FIG. 18 is a top view illustrating a method of manufacturing the semiconductor device of FIG. 17 in accordance with an exemplary embodiment.

The process that is substantially the same as or similar to those illustrated with reference to FIGS. 3 and 8 is performed.

Referring to FIG. 18, an etch mask pattern (not shown) is formed on the substrate having a preliminary insulation pattern to form the plurality of buried conductive patterns 115a of FIG. 17. The etch mask pattern exposes a portion of the preliminary pattern under which a plurality of buried conductive patterns 115a will be formed later.

The preliminary insulation pattern is partially etched using the etch mask pattern 106a to form a plurality of recesses 109. Each of the recesses 109 has a linear shape extending in the second direction. Each of the recesses 109 is connected to another.

Then, processes that is substantially the same as or similar to those illustrated with reference to FIGS. 5 to 7 is performed to form the semiconductor device of FIG. 18.

Figure 19:
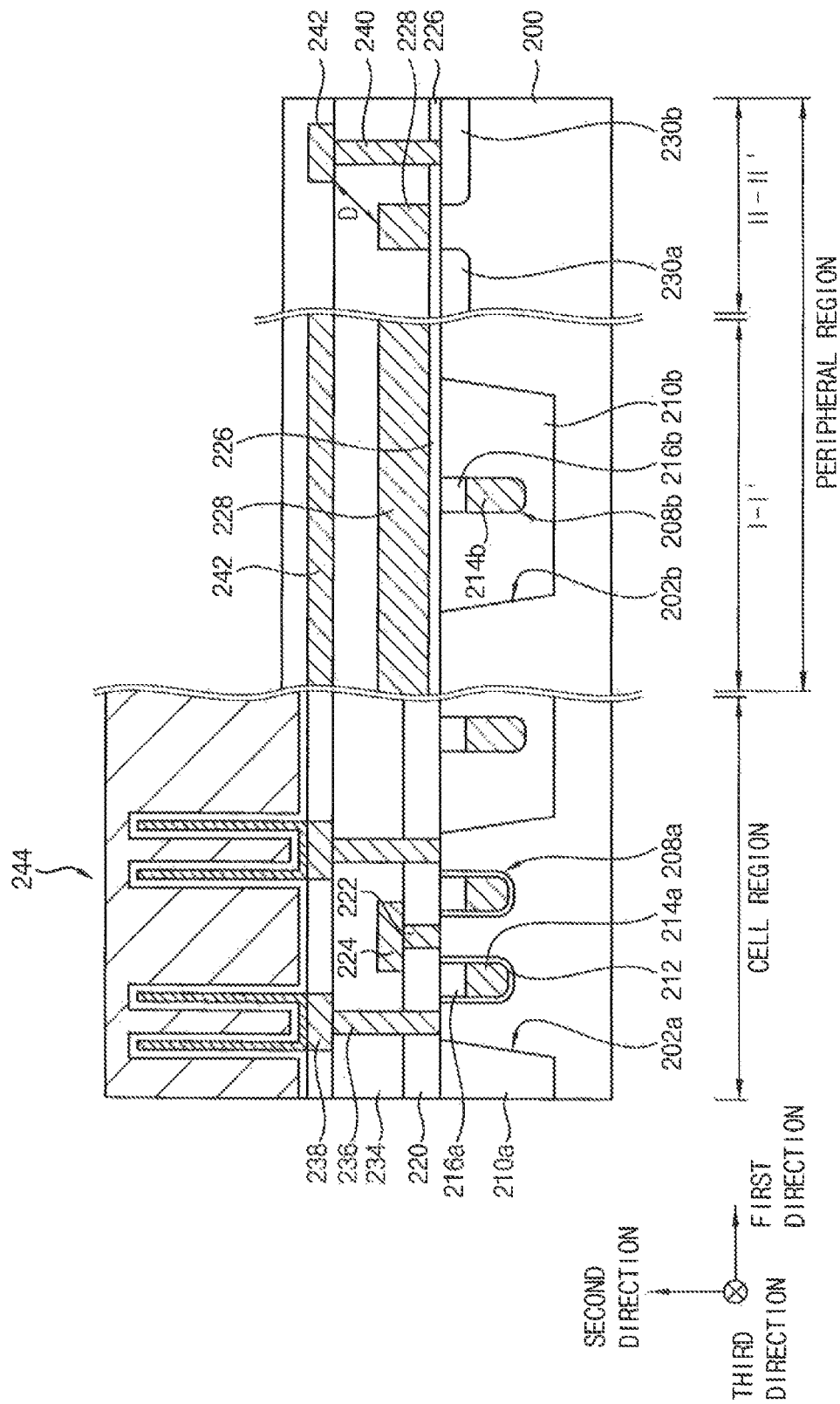
FIG. 19 is a cross-sectional view illustrating a semiconductor device in accordance with an exemplary embodiment of the inventive concept.
Figure 20:
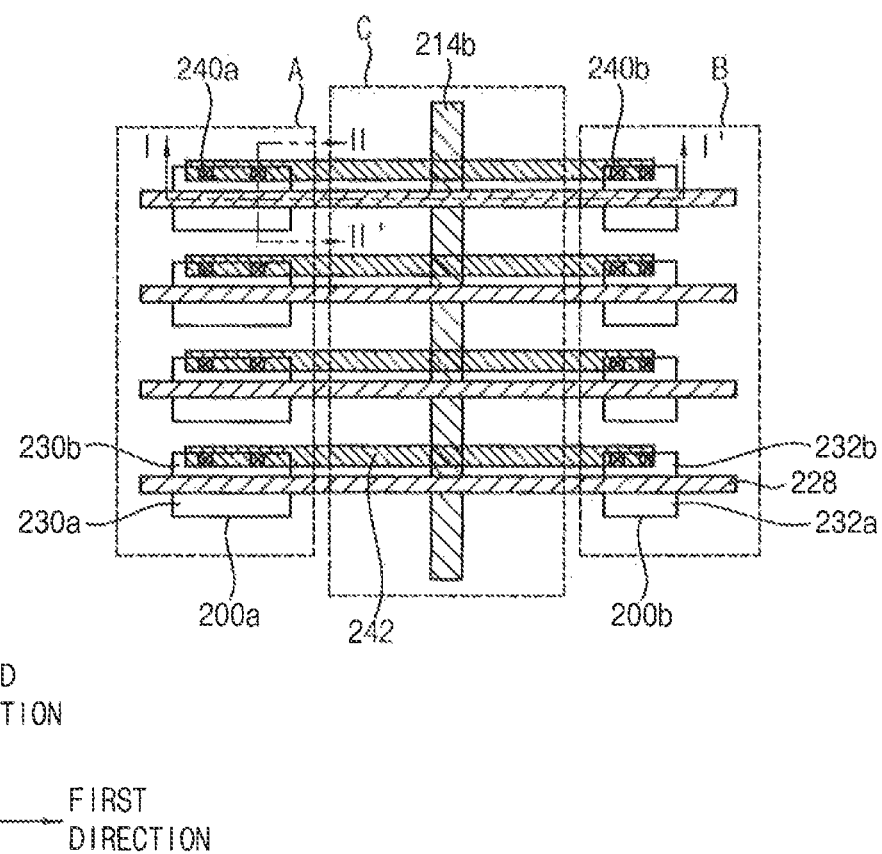
FIG. 20 is a top view illustrating a peripheral region in the semiconductor device of FIG. 19 in accordance with an exemplary embodiment of the inventive concept.

FIG. 19 is a cross-sectional view illustrating a semiconductor device in accordance with an exemplary embodiment. FIG. 20 is a top view illustrating a peripheral region of the semiconductor device of FIG. 19 in accordance with an exemplary embodiment.

The semiconductor device of FIG. 19 includes a peripheral region and a cell region. The peripheral region of the semiconductor device corresponds to a cross-sectional view taken along line I-I' and line II-II' of the semiconductor device of FIG. 20. The semiconductor device in FIG. 19 may be a dynamic random access memory (DRAM) device.

Referring to FIGS. 19 and 20, a substrate 200 may have the cell region in which memory cells may be formed and the peripheral region in which peripheral circuits may be formed. The memory cells in the cell region will be illustrated hereinafter.

The substrate 200 may be divided into an active region and an isolation region. The active region is defined by the isolation region.

A buried gate structure is formed in the active region of the cell region. The buried gate structure extends in a third direction. The buried gate structure includes a gate insulation layer 212 and a buried gate electrode 214a sequentially stacked. A top surface of the buried gate electrode 214a is lower than a top surface of the substrate 200. Source and drain regions (not shown) may be formed at both sides of the buried gate structure. A buried transistor including the source and drain regions and the buried gate structure may serve as a selection transistor of each memory cell.

A bit line structure including a bit line contact 222 and a bit line 224 is formed on the substrate 200 in which the buried transistor may be formed. A storage node contact 236 and a capacitor 244 are formed on the substrate 200. A pad pattern 238 is formed between the storage node contact 236 and the capacitor 244. First and second insulating interlayers 220 and 234 covering the bit line structure and the storage node contacts 236 therein are formed on the substrate 200.

NMOS and PMOS transistors may be formed in the peripheral region. The NMOS and PMOS transistors may be configured to form a plurality of inverters. The NMOS and PMOS transistors in the peripheral region may have structures substantially the same as those illustrated in FIG. 1.

Referring to FIG. 20, the peripheral region includes a first region A where the NMOS transistors are arranged and a second region B where the PMOS transistors are arranged. The first region A and the second region B are separated from each other by an isolation region C. The first region A and the second region B are formed at opposite sides of the isolation region C.

The isolation region C is formed between the first and second regions A and B in the substrate 200. The substrate 200 may be partially etched to form a trench in the isolation region, and an insulation layer pattern may be formed to fill the trench. For example, a trench 202b is formed in the isolation region of the peripheral region, and an insulating layer pattern 210b fills the trench 202b to form the isolation region C.

At least one buried conductive pattern 214b is formed in the insulation layer pattern 210b of the peripheral region. A top surface of the buried conductive pattern 214b is lower than that of a top surface of the substrate 200. The top surface of the substrate 200 is substantially coplanar with a top surface of the insulation layer pattern 210b. The buried conductive pattern 214b may have a linear shape extending in a second direction substantially perpendicular to the first direction.

A liner (not shown) may be further formed on a sidewall and a bottom surface of the buried conductive pattern 214b. The liner may include a material substantially the same as that of the gate insulation layer 212. The buried conductive pattern 214b and the buried gate electrode 214a may have substantially the same structure. The buried conductive pattern 214b may include an insulating material substantially the same as or different from that of the buried gate electrode 214a.

An insulation mask pattern 216b is formed on the buried conductive pattern 214b.

A plurality of first active regions 200a and a plurality of second active regions 200b are formed in the first and second regions A and B of the substrate 200, respectively.

A pair of the NMOS and PMOS transistors opposite to each other in the first direction includes a gate insulation layer 226 and a common gate pattern 228. The common gate pattern 228 extends over the first region A, the isolation region C and the second region B in the first direction. The common gate pattern 228 extends in a direction substantially perpendicular to a direction in which the buried conductive pattern 214 extends.

The common gate pattern 228 may include a material substantially the same as or different from that of the bit line contact 222 and the bit line 224.

The common gate pattern 228 includes a first gate portion serving as a gate electrode of the NMOS transistor, a second gate portion serving as a gate electrode of the PMOS transistor and a connection portion connecting the first and second gate regions on the isolation region of the substrate 200. The first and second gate portions are directly connected to each other without using additional contact plugs or conductive lines.

A first source region 230a and a first drain region 230b are formed in upper portions of the first active region 200a at both sides of the first gate portion, and a second source region 232a and a drain region 232b are formed in upper portions of the second active region at both sides of the second gate portion.

First and second insulating interlayers 220 and 234 may cover the NMOS and PMOS transistors.

First contact plugs 240a are connected to the first drain regions 230b of the NMOS transistors, and second contact plugs 240b are connected to the second drain regions 232b of the PMOS transistors. An upper wiring line 242 is formed on the first and second contact plugs 240a and 240b, and the first and second drain regions 230b and 232b are electrically connected to each other via the first and second contact plugs 240a and 240b and the upper wiring line 242.

The upper wiring line 242 may have a linear shape extending in the first direction. For example, the upper wiring line 242 and the common gate pattern 228 extend in substantially the same direction.

The upper wiring line 242 is placed at a level higher than that of the common gate pattern 228. Thus, the upper wiring line 242 and the common gate pattern 228 are spaced apart from each other in a vertical direction. The distance D between the upper wiring line 242 and a common gate pattern 228 may be easily increased to reduce parasitic capacitance therebetween.

The wiring lines may be placed and routed without considering the buried conductive pattern 214b when a layout design is made for the semiconductor device. Additionally, due to the reduction of the parasitic capacitance of the semiconductor device, an operation speed of the peripheral circuits may be increased, and thus, the semiconductor device may have a higher performance.

FIGS. 21 to 26 are cross-sectional views illustrating a method of manufacturing the semiconductor device of FIG. 19 in accordance with an exemplary embodiment.

Figure 21:
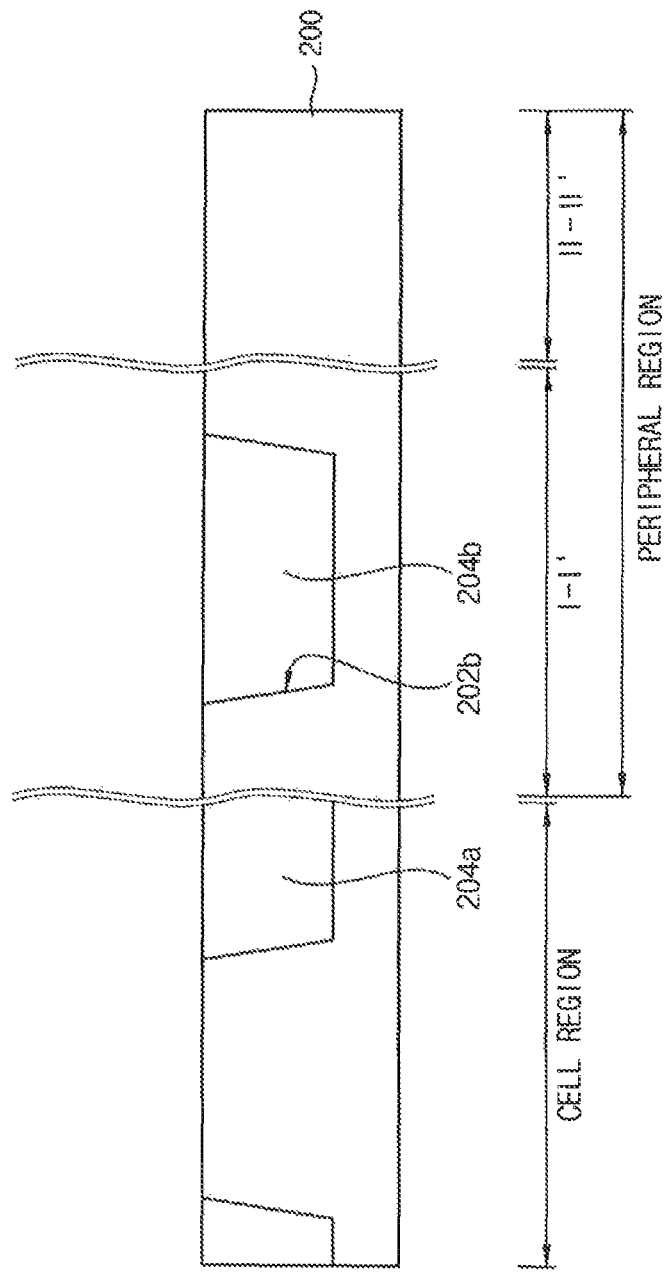
FIGS. 21 to 26 are cross-sectional views illustrating a method of manufacturing the semiconductor device of FIG. 19 in accordance with an exemplary embodiment of the inventive concept.

Referring to FIG. 21, a first etch mask pattern (not shown) is formed on a substrate 200. The substrate 200 has a first region A for forming NMOS transistors and a second region B for forming PMOS transistors. The first and second regions A and B are opposite to each other along a first direction. A first trench 202a and a second trench 202b are formed by partially etching the substrate 200 using the first etch mask pattern. The first trench 202a is formed in a cell region of the substrate 200, and the second trench 202b is formed in a peripheral region of the substrate 200. The second trench 202b is formed between the first region A and the second region B, and further in the first region A and in the first region B.

A first insulation layer is formed to fill the first and second trenches 202a and 202b. The first insulation layer is planarized to form preliminary first and second insulation layer patterns 204a and 204b in the first and second trenches 202a and 202b, respectively. Then, the first etch mask pattern is removed.

Figure 22:
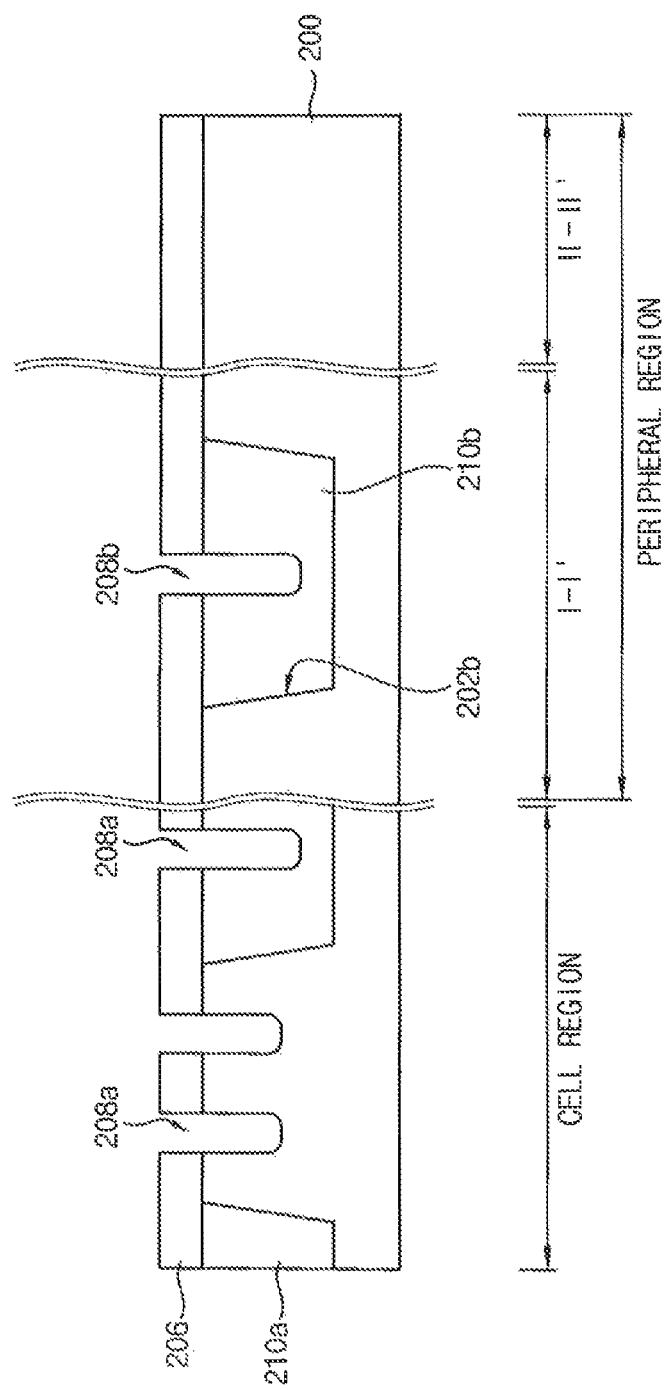

Referring to FIG. 22, a second mask pattern 206 is formed on the preliminary first and second insulation patterns 204a and 204b and the substrate 200. The second etch mask pattern 206 exposes a portion of the preliminary first and second insulation patterns 204a and 204b under which a gate electrode 214a and a buried conductive pattern 214b of FIG. 26 will be formed.

The exposed portions of the first and second preliminary insulation patterns 204a and 204b are partially etched using the second etch mask pattern 206 to form first and second recesses 208a and 208b, respectively. A buried gate electrode will be formed in the first recess 208a of the cell region. A buried conductive pattern will be formed in the second recess 208b of the peripheral region.

By the above etching process, a first insulation pattern 210a and a second insulation pattern 210b having the first and second recesses 208a and 208b, respectively, are formed.

The first recess 208a has a linear shape extending in the third direction, and the second recess 208b is formed between the first and second regions A and B.

Figure 23:
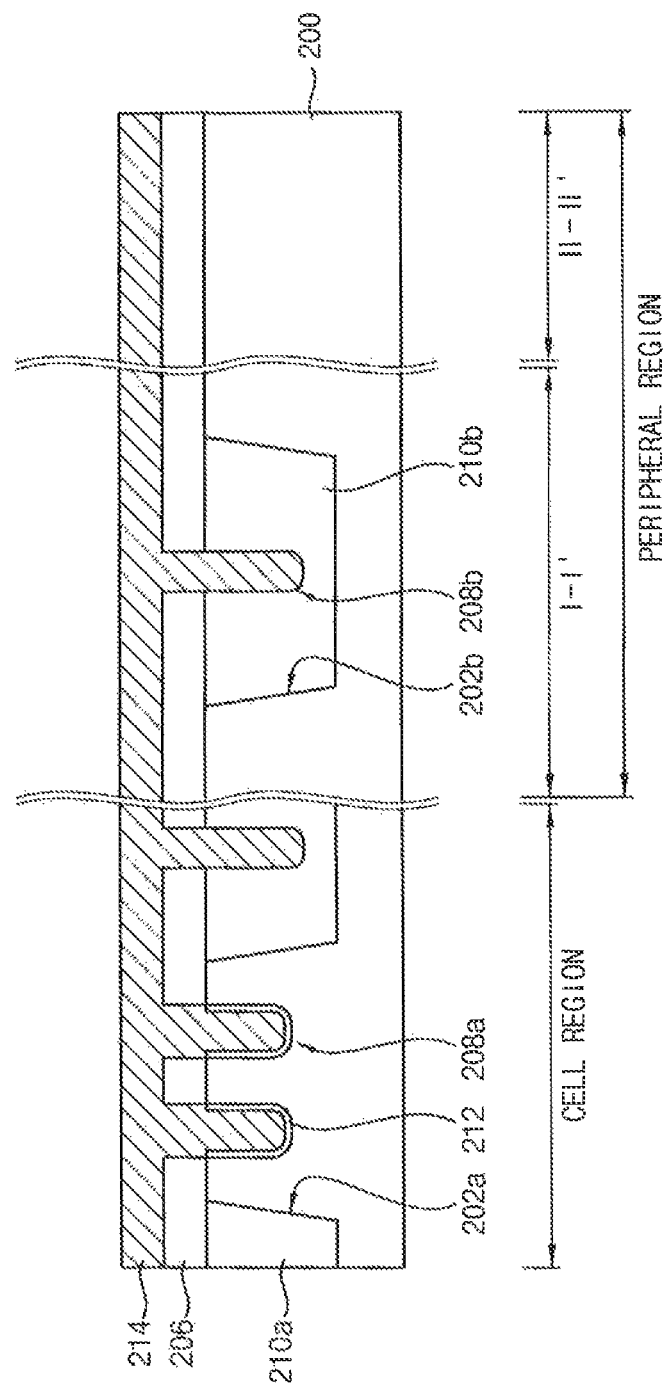

Referring to FIG. 23, a gate insulation layer 212 is formed in the first recess 208a. The gate insulation layer 212 may be formed by oxidizing a portion of the substrate 100 exposed by the first recess 208a. For example, the gate insulation layer 212 may be formed by a chemical vapor deposition (CVD) process or an atomic layer deposition (ALD) process. In this case, a liner (not shown) may be further formed on an inner-wall of the second recess 208b.

A conductive layer 214 is formed on the second etch mask pattern 206 to sufficiently fill the first and second recesses 208a and 208b.

The conductive layer 214 may include polysilicon, a metal, a metal nitride, or a combination thereof. The metal or metal nitride of the conductive layer 214 may include titanium, titanium nitride, tantalum, tantalum nitride, or tungsten.

Figure 24:
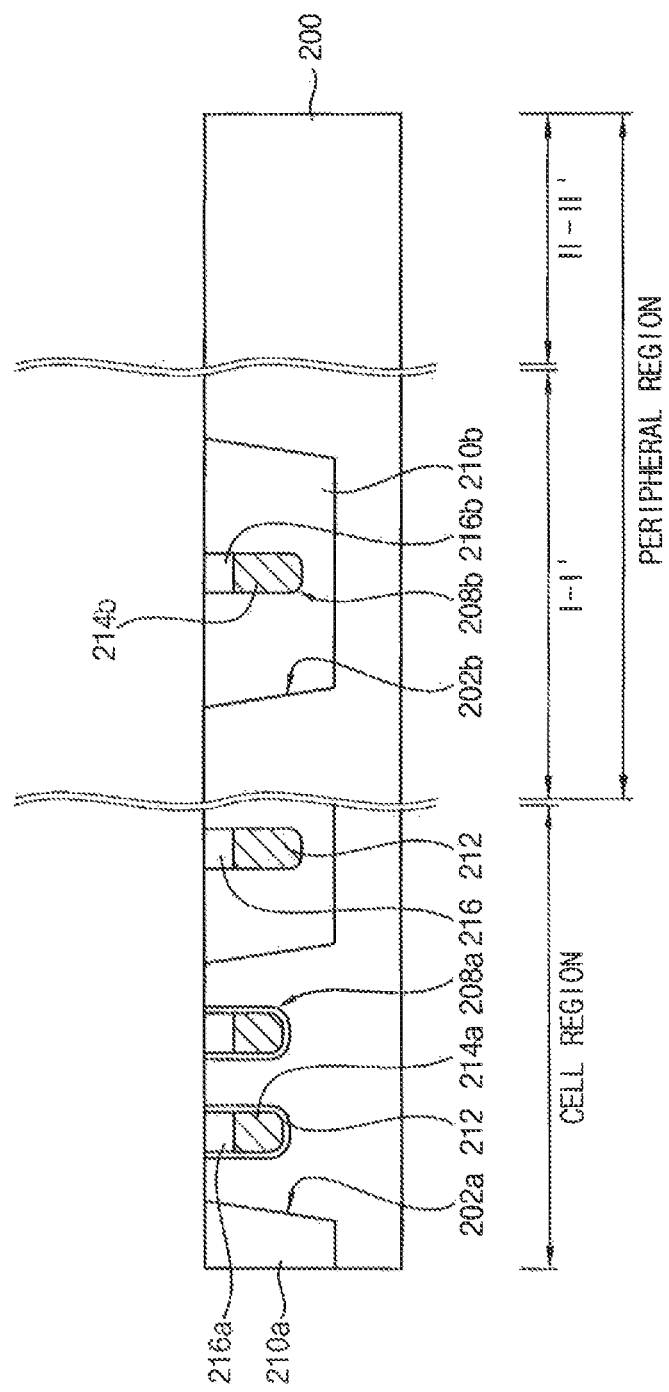

Referring to FIG. 24, the conductive layer 214 is planarized so that the conductive layer 214 remains only in the first and second recesses 208a and 208b. The planarization process may be performed by, a CMP process, and/or etch back process, for example. The conductive layer remained in the first and second recesses 208a and 208b may be partially etched to form a buried conductive electrode 214a in the first recess 208a and a buried conductive pattern 214b in the second recess 208b. The buried conductive electrode 214a has a top surface lower than a top surface of the substrate 200, and the buried conductive pattern 214b has a top surface lower than the top surface of the substrate 200.

A second insulation layer is formed on the buried conductive electrode 214a and the buried conductive pattern 214b to fill the first and second recesses 208a and 208b. The second insulation layer may include an insulating material, for example, silicon oxide, silicon nitride, or silicon oxide nitride. The insulating material of the second insulation layer may be substantially the same as or different from that of the first insulation layer.

The second insulation layer is planarized to form third and fourth insulation layer patterns 216a and 216b in the first and second recesses 208a and 208b, respectively. The third insulation layer pattern 216a is formed on the buried gate electrode 214a, and the fourth insulation layer pattern 216b is formed on the buried conductive pattern 214b.

The buried conductive pattern 214b of the peripheral region and the buried gate electrode 214a of the cell region may be formed simultaneously. For example, the buried conductive pattern 214b is simultaneously formed when a series of processes is applied to form the buried gate electrode 214a. The series of processes may include a deposition process, a planarization process and an etch process. Therefore, additional processes for forming the buried conductive pattern 214b in the peripheral region need not be required.

Then, the second etch mask is removed to expose a top surface of the substrate 200. The exposed top surface of the substrate 200 may serve as an active region.

Figure 25:
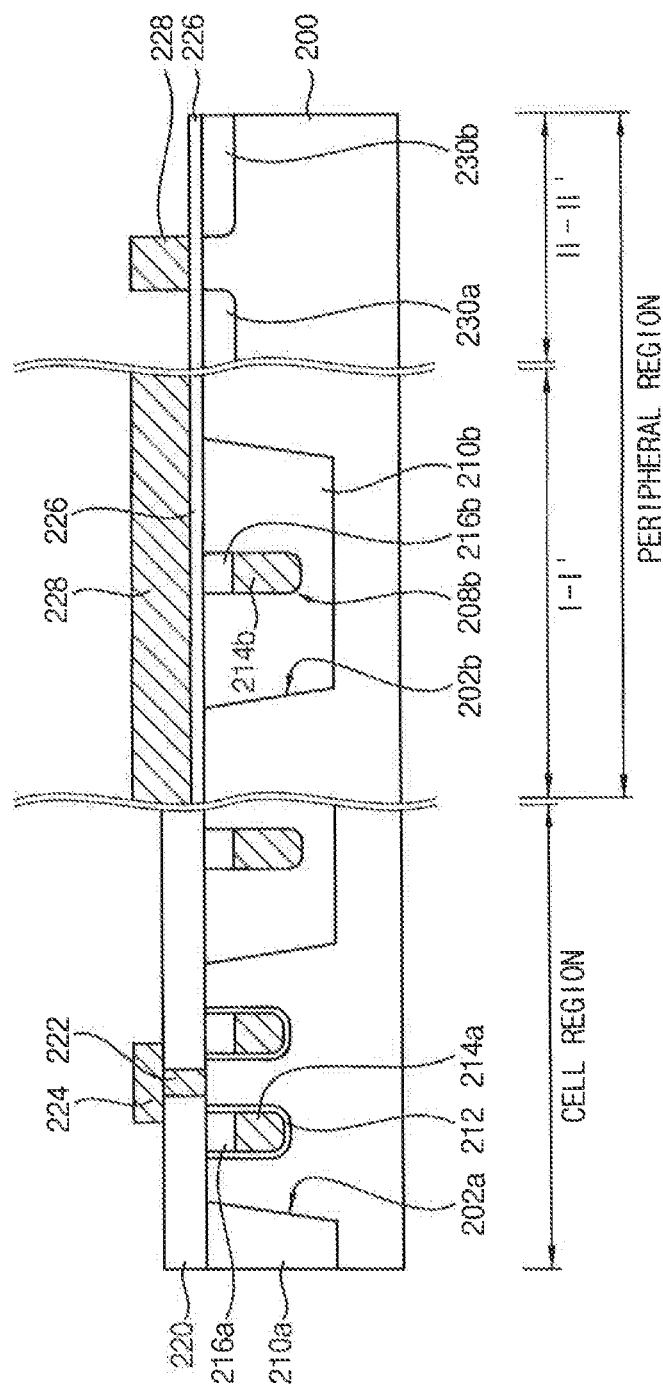

Referring to FIG. 25, a first insulating interlayer 220, a bit line contact 222 and a bit line 224 are formed in the cell region of the substrate 200. A gate insulation layer 226 and common gate patterns 228 are formed in the peripheral region of the substrate 200.

Each of the common gate patterns 228 extends in the first direction, and may serve as a common gate electrode of the NMOS and PMOS transistors.

Due to the common gate patterns 228, the gates electrodes of the PMOS and NMOS transistors are directly connected to each other without using additional contact plugs or conductive lines.

The common gate patterns 228 may include a material substantially the same as those of the bit line contact 222 and the bit line 224.

Figure 26:
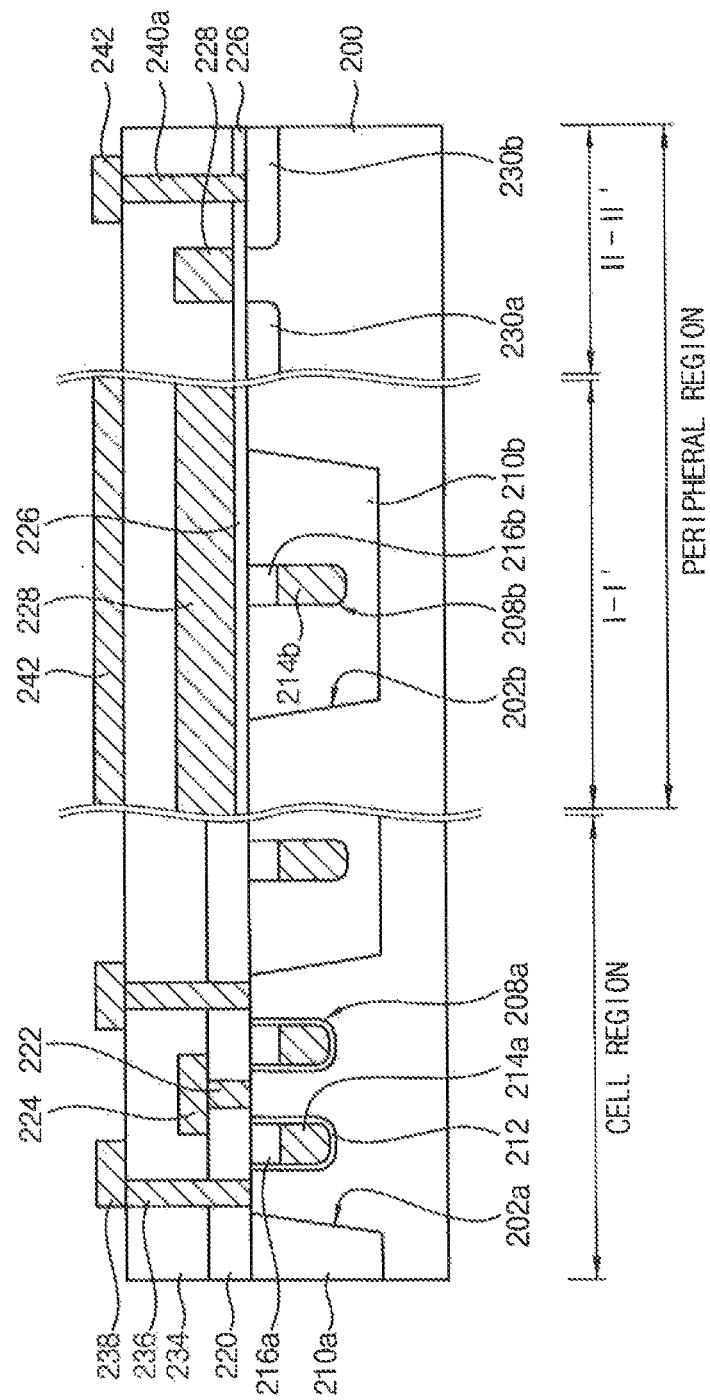

Referring to FIGS. 26 and 20, n-type impurities may be implanted into the substrate 200 in the first region A to form first source and drain regions 230a and 230b, and p-type impurities may be implanted into the substrate 200 in the second region B to form second source and drain regions 232a and 232b.

The NMOS and PMOS transistors including the common gate patterns 228 may be formed by the above processes.

A second insulating interlayer 234 may be formed on the first insulating interlayer 220 to cover the bit line 224 and the NMOS and PMOS transistors. A storage node contact 236 is formed in the cell region. A pad pattern 238 is formed on the storage node contact 236. Alternatively, the pad pattern 238 need not be formed on the storage node contact 236.

First contact plugs 240a and second contact plugs 240b are formed to contact the first drain regions 230b of the NMOS transistors and the second drain regions 232b of the PMOS transistors, respectively. An upper wiring line 242 is formed on the first and second contact plugs 240a and 240b to connect the first and second contact plugs 240a and 240b to each other.

The upper wiring line 242 has a linear shape extending in the first direction. The upper wiring line 242 extends in a direction substantially the same as that of the common gate electrode 228.

Referring back to FIG. 19, a capacitor 244 is formed to be electrically connected to the storage node contact 236. The capacitor 244 is in contact with a top surface of the pad pattern 238.

The semiconductor device in FIG. 19 may be formed by the above processes. The semiconductor device include the buried conductive pattern 214b, and thus the common gate electrode 228 is formed over the buried conductive pattern 214b. Additionally, the upper wiring line 242 is placed at a level higher than that of the common gate pattern 228. Thus, the upper wiring line 242 and the common gate pattern 228 are spaced apart from each other in a vertical direction. In addition, the distance D between the upper wiring line 242 and the common gate pattern 228 may be easily increased to reduce parasitic capacitance therebetween.

The semiconductor device in accordance with an exemplary embodiment may be applied to various types of application systems, for example, a computer system.

Figure 27:
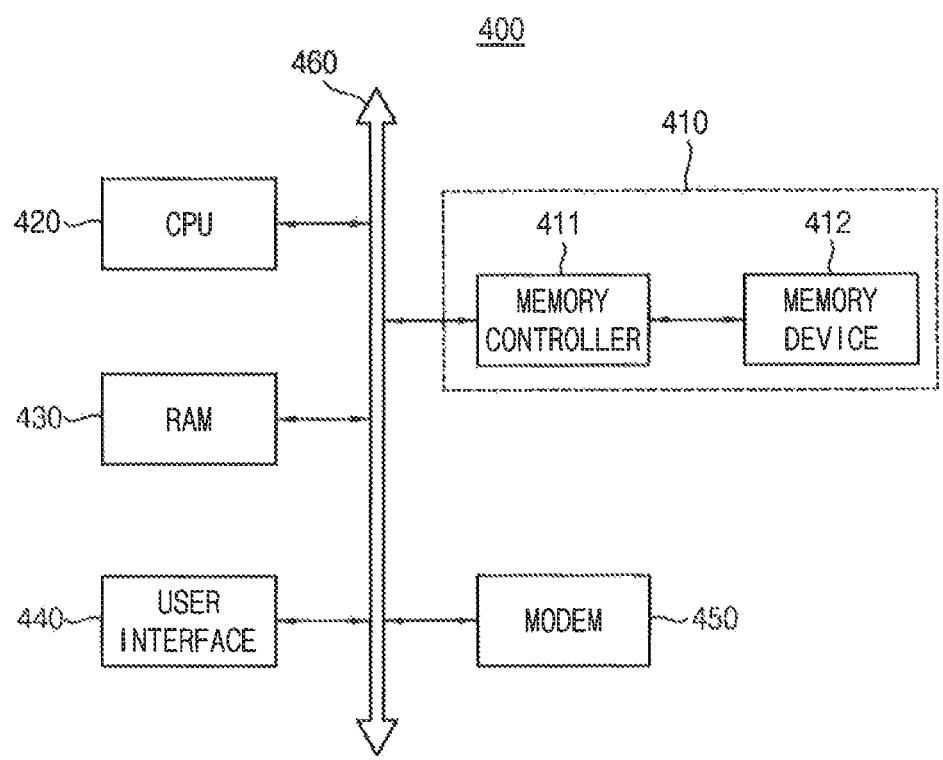
FIG. 27 is a block diagram illustrating an application system in accordance with an exemplary embodiment of the inventive concept.

FIG. 27 is a block diagram illustrating an application system in accordance with an exemplary embodiment.

Referring to FIG. 27, an application system 400 may include a CPU 420 electrically connected to a system bus 460, a RAM (Random Access Memory) 430, a user interface 440, a modem 450 and a memory system 410. The memory system 410 includes a memory device 412 and a memory controller 411. The memory device 412 includes a DRAM device in accordance with an exemplary embodiment. The memory system 410 including the memory device 412 and the memory controller 411 may serve as a memory card or a solid state disk (SSD). When the system 400 is a mobile device, a battery of the mobile device may be provided to supply an operating voltage of the system 400. The system 400 in accordance with an exemplary embodiment may further include an application chipset, a camera image processor (CIS), a mobile DRAM, etc.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a substrate including an isolation region, a first region disposed at one side of the isolation region and a second region disposed at an opposite side of the isolation region, the first region and the second region arranged in a first direction;
a trench disposed in the isolation region;
an insulation layer pattern structure disposed in the trench;
a buried conductive pattern enclosed by the insulation layer pattern structure, the buried conductive pattern having a top surface lower than a top surface of the substrate, the buried conductive pattern extended in a second direction crossing the first direction;
a first gate insulation layer disposed on the substrate;
a common gate pattern disposed on the first gate insulation layer, the common gate pattern extended in the first direction, and the common gate pattern overlapped with the first region, the isolation region and the second region;
a first source region and a first drain region disposed in upper portions of the first region, the first source region disposed at one side of the common gate pattern, the first drain region disposed at an opposite side of the common gate pattern, the first source region and the first drain region having impurities of a first conductivity type; and
a second source region and a second drain region disposed in upper portions of the second region, the second source region disposed at the one side of the common gate pattern, the second drain source region disposed at the opposite side of the common gate pattern, the second source region and the second drain region having impurities of a second conductivity type.

2. The semiconductor device of claim 1, further comprising another common gate pattern, the another common gate pattern substantially parallel to the common gate pattern.

3. The semiconductor device of claim 1, wherein a first portion of the common gate pattern overlapped with the first region, the first source region and the first drain region serve as a first conduction type MOS transistor, wherein a second portion of the common gate pattern overlapped with the second region, the second source region and the second drain region serve as a second conduction type MOS transistor, and wherein a third portion of the common gate pattern overlapped with the isolation region connects the first portion of the common gate pattern and the second portion of the common gate pattern.

4. The semiconductor device of claim 3, wherein the first portion of the common gate pattern has a first width, the second portion of the common gate pattern has a second width, and the third portion of the common gate pattern has a third width, wherein the first width, the second width and the third width are measured in the second direction.

5. The semiconductor device of claim 4, wherein the first width, the second width and the third width are substantially the same with each other.

6. The semiconductor device of claim 1, wherein a plurality of buried conductive patterns is formed, the plurality of buried conductive patterns substantially parallel to each other.

7. The semiconductor device of claim 6, further comprising another buried conductive pattern, the another buried conductive pattern connected to the buried conductive patterns.

8. The semiconductor device of claim 7, wherein the another buried conductive pattern is enclosed by the insulation layer pattern structure, the another buried conductive pattern spaced apart from the buried conductive patterns.

9. The semiconductor device of claim 1, wherein the isolation region, the first region and the second region are disposed in a peripheral region of the substrate, wherein the semiconductor device further includes a buried transistor including a second gate insulation layer and a buried gate electrode disposed in a cell region of the substrate, wherein the peripheral region is adjacent to the cell region.

10. The semiconductor device of claim 9, wherein the buried gate electrode includes a material that is substantially the same as that of the buried conductive patterns.

11. The semiconductor device of claim 1, further comprising:
    first and second contact plugs contacting the first and second drain regions, respectively; and
    an upper wiring line connecting the first and second contact plugs.

12. The semiconductor device of claim 11, wherein the upper wiring line has a linear shape extended in the first direction, and the upper wiring is disposed over the common gate pattern.

13. A method of manufacturing a semiconductor device, comprising;
    forming a trench in a substrate, the substrate including a first region disposed at one side of the trench and a second region disposed at an opposite side of the trench, the first region and the second region arranged in a first direction;
    forming a first insulation layer pattern in the trench to fill the trench;
    forming a recess in the first insulation layer pattern, the recess extended in a second direction crossing the first direction;
    forming a buried conductive pattern in the recess, wherein the buried conductive pattern, extended in the second direction, has a top surface lower than a top surface of the substrate;
    forming a second insulation pattern in the recess, the second insulation pattern covering the buried conductive pattern in the recess;
    forming a first gate insulation layer on the substrate and the second insulation pattern;
    forming a common gate pattern on the first region, the second region and the second insulation pattern, the common gate pattern extended in the first direction;
    implanting impurities of a first conductivity type into the first region; and
    implanting impurities of a second conductivity type into the second region.

14. The method of claim 13, wherein the substrate further includes a cell region adjacent to a peripheral region including the trench, the first region and the second region, and the method further including:
    forming a buried transistor having a second gate insulation layer and a buried gate electrode in the cell region.

15. The method of claim 14, wherein the buried conductive pattern is simultaneously formed when the buried gate electrode is formed using a deposition process and a planarization process.

16. A semiconductor device, comprising:
    a cell region disposed in a substrate, the cell region including a memory cell;
    a peripheral region disposed in the substrate, the peripheral region adjacent to the cell region, the peripheral region having a trench isolation, a first active region and a second active region, the trench isolation interposed between the first active region and the second active region;
    a common gate pattern disposed on the peripheral region, wherein the common gate pattern extends in a first direction and partially overlaps the first active region, the second active region and the trench isolation;
    a buried conductive pattern enclosed by the trench isolation, the buried conductive pattern extended in a second direction crossing the first direction, a top surface of the buried conductive pattern lower than a bottom surface of the common gate pattern.

17. The semiconductor device of claim 16, further comprising a buried gate electrode disposed in the cell region, the buried gate electrode having a top surface lower than the top surface of the substrate.

18. The semiconductor device of claim 16, wherein the first active region includes a first source region disposed at one side of the common gate pattern and a first drain region disposed at an opposite side of the common gate pattern, wherein the second active region includes a second source region disposed at the one side of the common gate pattern and a second drain region disposed at the opposite side of the common gate pattern, wherein the first source region and the first drain region of the first active region include impurities of a first conductivity type, wherein the second source region and the second drain region of the second active region include impurities of a second conductivity type.

19. The semiconductor device of claim 18, further comprising an upper wiring line, the first drain region of the first active region and the second drain region of the second active region electrically coupled to each other through the upper wiring line.

20. The semiconductor device of claim 19, wherein a bottom surface of the upper wiring is higher than a top surface of the common gate pattern.

* * * * *